(12) United States Patent
Kasa et al.

(10) Patent No.: US 8,953,163 B2
(45) Date of Patent: Feb. 10, 2015

(54) EXPOSURE APPARATUS, EXPOSURE METHOD, AND METHOD OF MANUFACTURING SEMICONDUCTOR DEVICE

(71) Applicant: Kabushiki Kaisha Toshiba, Tokyo (JP)

(72) Inventors: Kentaro Kasa, Kanagawa (JP); Manabu Takakuwa, Mie (JP); Yosuke Okamoto, Mie (JP); Masamichi Kishimoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 13/779,209

(22) Filed: Feb. 27, 2013

(65) Prior Publication Data

US 2014/0065528 A1    Mar. 6, 2014

(30) Foreign Application Priority Data

Sep. 6, 2012  (JP) .................................. 2012-196401

(51) Int. Cl.
 *G01B 11/00* (2006.01)
 *G03F 7/20* (2006.01)
(52) U.S. Cl.
 CPC ...................................... *G03F 7/20* (2013.01)
 USPC ........................................................ 356/399
(58) Field of Classification Search
 USPC ................................................. 356/399–401
 See application file for complete search history.

(56) References Cited

U.S. PATENT DOCUMENTS

| 6,657,207 B2 | 12/2003 | Kawata et al. |
| 6,885,450 B2 * | 4/2005 | Fukui ............................. 356/401 |
| 7,218,399 B2 * | 5/2007 | Hayano ......................... 356/401 |
| 7,239,368 B2 | 7/2007 | Oesterholt et al. |
| 7,248,365 B2 | 7/2007 | Schedel et al. |
| 7,433,051 B2 | 10/2008 | Owen |
| 8,088,539 B2 * | 1/2012 | Yamanaka ....................... 430/22 |
| 2011/0032496 A1 * | 2/2011 | Shibazaki ....................... 355/30 |

FOREIGN PATENT DOCUMENTS

| JP | 2001-267238 | 9/2001 |
| JP | 2002-203773 | 7/2002 |
| JP | 2004-172624 | 6/2004 |

\* cited by examiner

*Primary Examiner* — Michael A Lyons
(74) *Attorney, Agent, or Firm* — Finnegan, Henderson, Farabow, Garrett & Dunner, L.L.P.

(57) ABSTRACT

An exposure apparatus according to an embodiment controls the positioning between layers using an alignment correction value calculated on the basis of lower layer position information of a lower-layer-side pattern and upper layer position information of an upper-layer-side pattern. The lower layer position information includes alignment data, a focus map, and a correction value which is set on the basis of the previous substrate. The upper layer position information includes alignment data, a focus map, and a correction value which is a correction value for the positioning and is used when the upper-layer-side pattern is transferred.

20 Claims, 8 Drawing Sheets

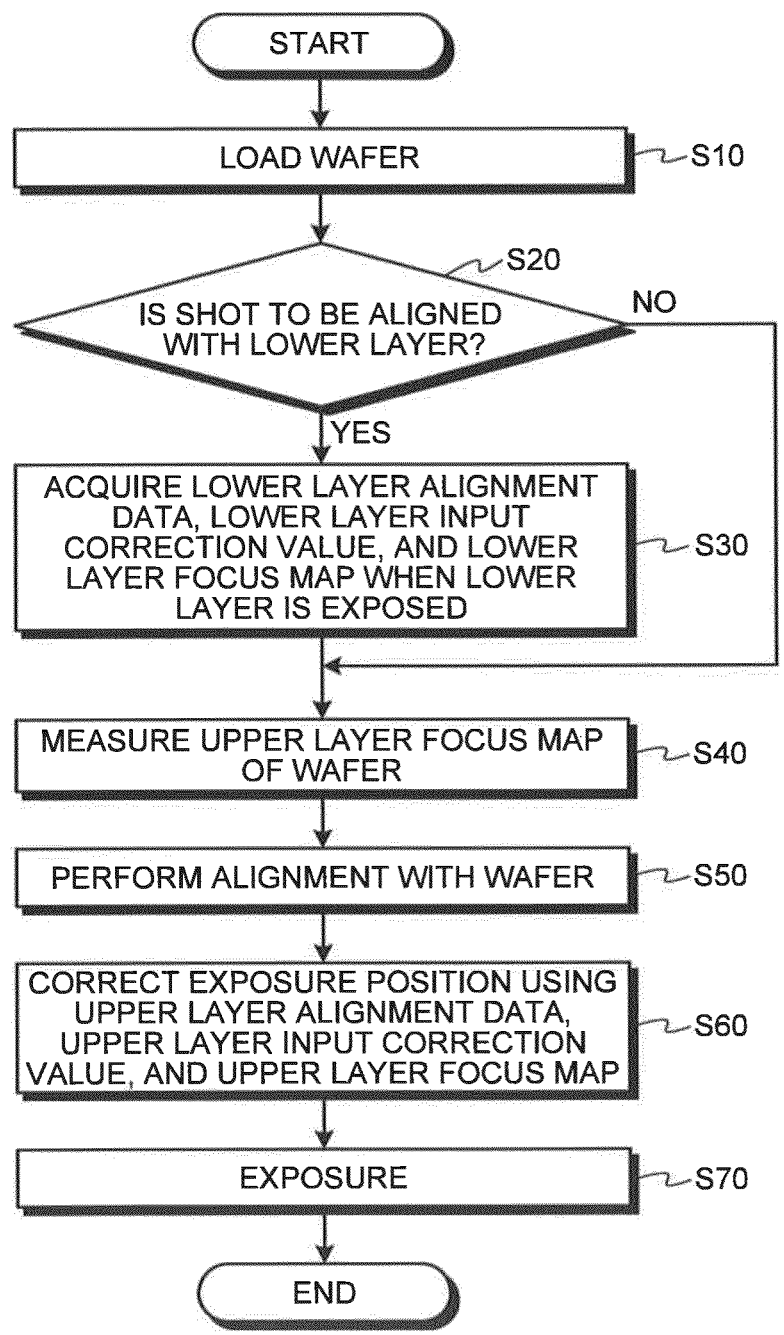

EXPOSURE APPARATUS, EXPOSURE METHOD, AND METHOD OF MANUFACTURING SEMICONDUCTOR DEVICE

CROSS-REFERENCE TO RELATED APPLICATIONS

This application is based upon and claims the benefit of priority from Japanese Patent Application. No, 2012-196401, filed on Sep. 6, 2012; the entire contents of which are incorporated herein by reference.

FIELD

Embodiments described herein relate generally to an exposure apparatus, an exposure method, and a method of manufacturing a semiconductor device.

BACKGROUND

In a lithography process when a semiconductor device is manufactured, the overlay accuracy between a lower-layer-side pattern formed in a wafer and an upper-layer-side pattern to be formed is important. The reason is that, when the overlay accuracy is reduced, the manufactured semiconductor device does not operate correctly.

In a process of manufacturing the semiconductor device, an error occurs in the formation of films on the front and rear surfaces of the wafer with the progress of the process, which causes a difference in film stress between the front surface and the rear surface. As a result, the wafer warps. When an exposure apparatus zips the warped wafer, the distortion of the wafer is likely to remain, which causes a reduction in the overlay accuracy. Therefore, it is preferable to accurately overlap the layers of the semiconductor device.

BRIEF DESCRIPTION OF THE DRAWINGS

FIG. 2 is a flowchart illustrating the procedure of an exposure process according to the first embodiment;

DETAILED DESCRIPTION

According to an embodiment, an exposure apparatus is provided. The exposure apparatus includes an exposure unit that irradiates exposure light to an original plate on which a mask pattern is formed to transfer a pattern corresponding to the mask pattern to a substrate and a control unit that controls the exposure unit. The exposure unit includes an alignment data measuring unit that measures alignment data for the substrate and a focus map measuring unit that measures a focus map of the substrate. The control unit includes an alignment correction value calculating unit that calculates an alignment correction value used when an upper-layer-side pattern is positioned relative to a lower-layer-side pattern of an exposure target substrate, which is a substrate to be exposed, on the basis of lower-layer-side position information about a position of the lower-layer-side pattern and upper-layer-side position information about a position of the upper-layer-side pattern which is transferred to the exposure target substrate. The lower-layer-side position information includes lower layer alignment data which is alignment data measured when the lower-layer-side pattern is transferred, a lower layer focus map which is a focus map measured when the lower-layer-side pattern is transferred, and a lower layer correction value which is used when the lower-layer-side pattern is formed and is a correction value for the positioning that is set on the basis of a history of a positional deviation between a lower-layer-side pattern and an upper-layer-side pattern acquired from a substrate which is exposed earlier than the exposure target substrate. The upper-layer-side position information includes upper layer alignment data which is alignment data measured by the alignment data measuring unit when the upper-layer-side pattern is transferred, an upper layer focus map which is a focus map measured by the focus map measuring unit when the upper-layer-side pattern is formed, and an upper layer correction value which is a correction value for the positioning and is used when the upper-layer-side pattern is transferred. The control unit controls the positioning of the upper-layer-side pattern relative to the lower-layer-side pattern using the alignment correction value calculated by the alignment correction value calculating unit.

Hereinafter, an exposure apparatus, an exposure method, and a method of manufacturing a semiconductor device according to embodiments will be described in detail with reference to the accompanying drawings. The invention is not limited by these embodiments.

First Embodiment

Figure 1:
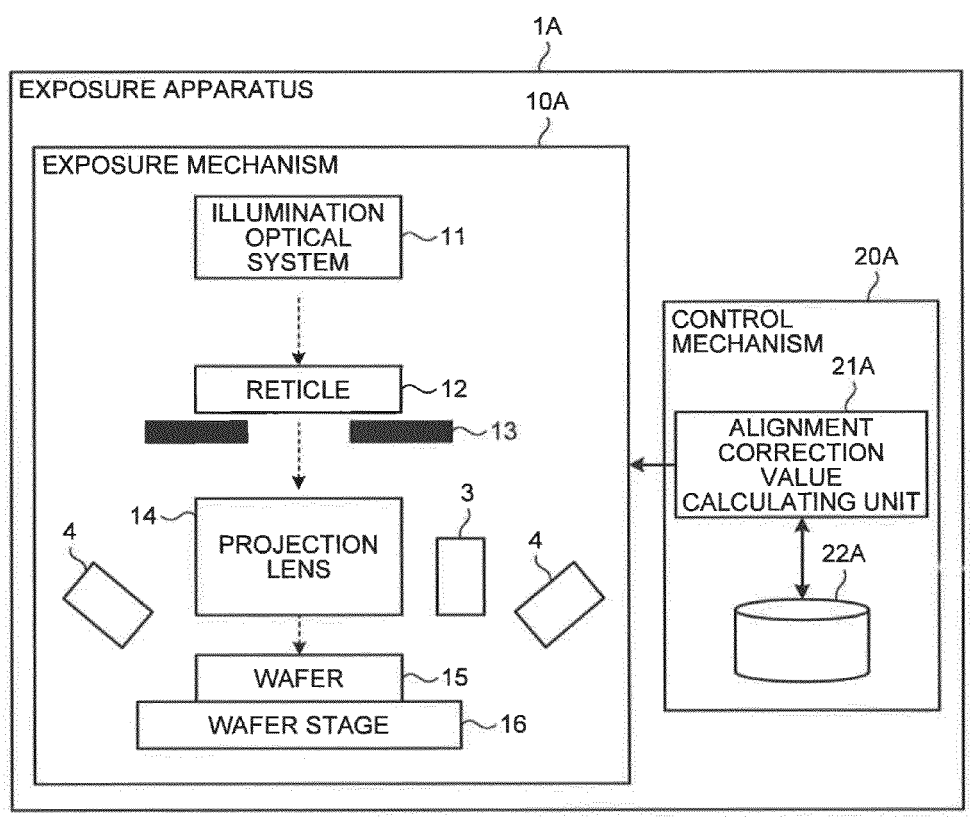
FIG. 1 is a diagram, illustrating the structure of an exposure apparatus according to a first embodiment.

FIG. 1 is a diagram illustrating the structure of an exposure apparatus according to a first embodiment. An exposure apparatus (semiconductor lithography apparatus) 1A is used in a lithography process when a semiconductor device is manufactured.

The exposure apparatus 1A according to this embodiment positions a second layer (upper-layer-side pattern) relative to a first layer (lower-layer-side pattern) and exposes the upper-layer-side pattern on the upper layer side of the lower-layer-side pattern. Specifically, when the lower-layer-side pattern is transferred, the exposure apparatus 1A acquires lower-layer-side position information (alignment data, an input correction value, and a focus map) about the position of the lower-layer-side pattern. Before the upper-layer-side pattern is transferred, the exposure apparatus 1A acquires upper-layer-side position information (alignment data, an input correction value, and a focus map) about the position of the upper-layer-side pattern. Then, the exposure apparatus 1A calculates an alignment correction value using the information about the position of the lower-layer-side pattern and the information about the position of the upper-layer-side pattern.

The exposure apparatus 1A includes an exposure mechanism 10A that performs reduced projection exposure on a wafer (substrate) 15 and a control mechanism 20A that controls the exposure mechanism 10A. The exposure mechanism 10A includes an illumination optical system 11, a reticle stage 13, a projection lens 14, a wafer stage 16, an alignment measurement device 3, and a focus map measurement device 4.

It is noted that the wafer stage 16 may include, for example, one wafer stage as illustrated in FIG. 1 or it may include a plurality of wafer stages for improvement of the throughput (not illustrated).

The illumination optical system 11 radiates exposure light irradiated from a light source (not illustrated) to a reticle (original plate) 12 having a mask pattern formed thereon. An alignment mark for measuring the position of the lower-layer-side pattern and a circuit pattern are formed on the reticle 12 that is used to form the lower-layer-side pattern. In addition, an alignment mark for measuring the position of the upper-layer-side pattern and a circuit pattern are formed on the reticle 12 that is used to form the upper-layer-side pattern.

The reticle 12 is mounted on the reticle stage 13. The projection lens 14 irradiates the exposure light transmitted through the reticle 12 to the wafer 15 and performs the reduced projection of the mask pattern onto the wafer 15. The wafer 15 is mounted on the wafer stage 16.

The alignment measurement device 3 measures the position of the alignment mark formed on the wafer 15 in the horizontal direction (the position of the alignment mark on the front surface of the wafer 15) (hereinafter, referred to as a mark position). For example, a circuit pattern and the alignment mark are formed on the wafer 15.

The focus map measurement device 4 measures the focus map of the wafer 15. The focus map indicates the distortion (unevenness) of the wafer 15 in the height direction. The focus map and the mark position are measured, with the wafer 15 mounted on the wafer stage 16.

Figure 9:
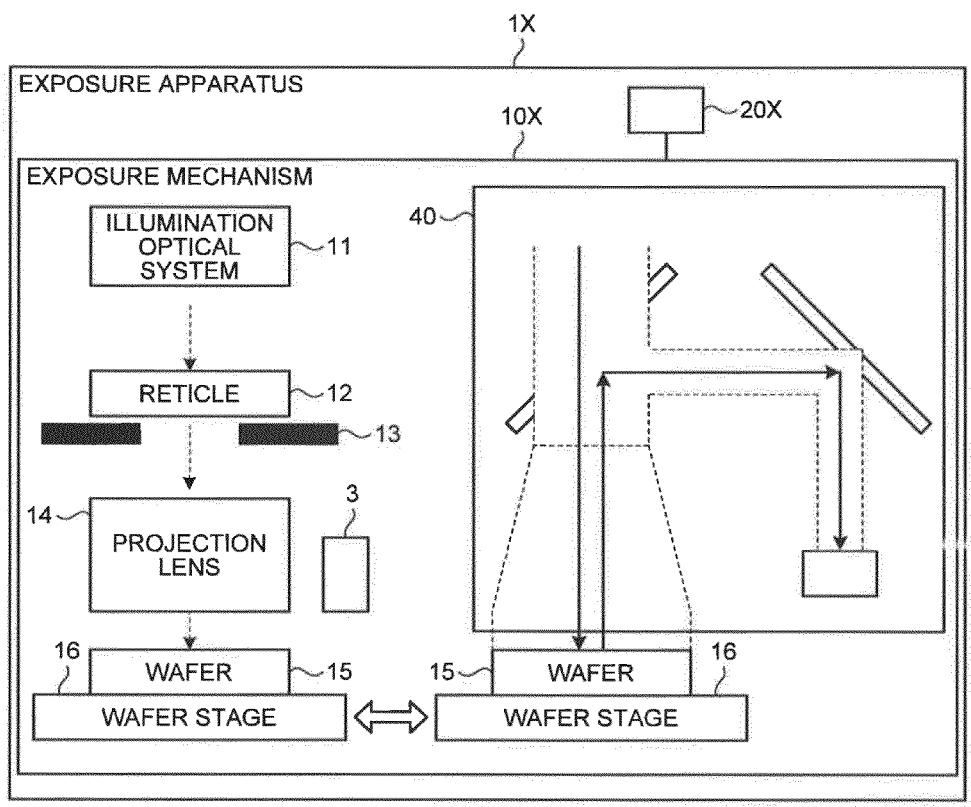
FIG. 9 is a diagram illustrating another example of a focus map measurement device.

The focus map measurement device 4 can be, for example, a type that performs measurement by emitting a laser beam obliquely as illustrated in FIG. 1 or a type that hits a beam on the entire surface of the wafer and measures an obtained interference pattern as illustrated in FIG. 9, which will be described later. The focus map measurement device 4 is not limited thereto.

The control mechanism 20A includes an alignment correction value calculating unit 21A and a measurement result database (DB) 22A. The alignment correction value calculating unit 21A calculates the alignment correction value using the alignment data, the input correction value, and the focus map of the lower-layer-side pattern and the alignment data, the input correction value, and the focus map of the upper-layer-side pattern.

The input correction value is used to correct the position measurement result (the measurement result of the mark position) of the alignment mark and is determined on the basis of the performance test for, for example, the previously processed wafer. In other words, the input correction value is a positioning correction value which is set on the basis of the history of the positional deviation between the lower-layer-side pattern and the upper-layer-side pattern obtained from the wafer which has been exposed earlier than the wafer 15, which is an exposure target. The input correction value may be input from an external apparatus to the alignment correction value calculating unit 21A, or it may be input to the alignment correction value calculating unit 21A by the user. In addition, the input correction value may be input from an external apparatus to the measurement result DB 22 or it may be input to the measurement result DB 22A by the user. Next, a case in which the input correction value is input to the measurement result DB 22A will be described.

The alignment correction value is used to correct the transfer position of the upper-layer-side pattern relative to the lower-layer-side pattern. The alignment correction value calculating unit 21A calculates the alignment correction value using the information stored in the measurement result DB 22A. The measurement result DB 22A is a database that stores the measurement result of the mark position, the measurement result of the focus map, and the input correction value. The measurement result DB 22A is formed by, for example, a memory.

When the wafer 15, which is an exposure target substrate, is exposed, the alignment measurement device 3 and the focus map measurement device 4 measure the wafer 15 which is transported from the outside of the exposure apparatus 1A to the exposure mechanism 10A. The measurement result of the mark position and the measurement result of the focus map are transmitted to the control mechanism 20A and are then stored in the measurement result DB 22A.

The alignment correction value calculating unit 21A calculates the alignment correction value using the data stored in the measurement result DB 22A. When the lower-layer-side pattern is transferred to the wafer 15, the input correction value for the lower-layer-side pattern is input from, for example, an external apparatus to the alignment correction value calculating unit 21A. When the lower-layer-side pattern is transferred to the wafer 15, the alignment data (alignment measurement result), the input correction value, and the focus map of the lower-layer-side pattern are stored in the measurement result DB 22A.

When the upper-layer-side pattern is transferred to the wafer 15, the input correction value for the upper-layer-side pattern is input from, for example, an external apparatus to the alignment correction value calculating unit 21A. The alignment data, the input correction value, and the focus map of the upper-layer-side pattern are stored in the measurement result DB 22A.

When the upper-layer-side pattern is transferred onto the lower-layer-side pattern, the alignment correction value calculating unit 21A calculates the alignment correction value, using the measurement result of the upper-layer-side pattern (the measurement result of the mark position and the measurement result of the focus map), the input correction value (upper-layer-side correction value) for the upper-layer-side pattern, the measurement result of the lower-layer-side pattern, and the input correction value (lower-layer-side correction value) used when the lower-layer-side pattern is transferred. The control mechanism 20A controls the exposure mechanism 10A such that the alignment correction value calculated by the alignment correction value calculating unit 21A is applied, thereby transferring the upper-layer-side pattern to the wafer 15.

In other words, the exposure mechanism 10A corrects the transfer position of the upper-layer-side pattern using the alignment correction value calculated by the alignment correction value calculating unit 21A. Then, the exposure mechanism 10A transfers the upper-layer-side pattern to the corrected transfer position.

When the alignment with the lower-layer-side pattern is not performed, the measurement process of the alignment measurement device 3 is omitted. The measurement result of the mark position, the measurement result of the focus map, or the input correction value may be stored in the measurement result DB 22A after the alignment correction value is calculated, or it may be stored in the measurement result DB 22A before the alignment correction value is calculated. In the case in which the measurement result of the mark position, the measurement result of the focus map, and the input correction value are stored in the measurement result DB 22A after the alignment correction value is calculated, they are input from, for example, the alignment measurement device 3, the focus map measurement device 4, and an external apparatus to the alignment correction value calculating unit 21A when the alignment correction value is calculated. In addition, the measurement result of the mark position, the measurement result of the focus map, or the input correction value may be stored in the measurement result DB 22A at any time before and after exposure.

Next, the procedure of the exposure process of the exposure apparatus 1A will be described. FIG. 2 is a flowchart illustrating the procedure of the exposure process according to the first embodiment. The exposure apparatus 1A loads the wafer 15 into the exposure mechanism 10A and mounts the wafer 15 on the wafer stage 16 (Step S10).

The exposure apparatus 1A sequentially performs the exposure process for each shot of the wafer 15. Before the exposure process is performed, the alignment correction value calculating unit 21A determines whether a shot, which is an exposure target, is to be aligned with a lower layer (lower-layer-side pattern) (Step S20).

When the shot, which is an exposure target, is to be aligned with the lower layer (Yes in Step S20), the alignment correction value calculating unit 21A acquires information about the position of the lower-layer-side pattern when the lower layer is exposed from the measurement result DB 22A.

Specifically, the alignment correction value calculating unit 21A acquires, from the measurement result DB 22A, the alignment data (lower layer alignment data) which is measured when the lower layer is exposed, the input correction value (lower layer input correction value) which is used when the lower layer is exposed, and the focus map (lower layer focus map) which is measured when the lower layer is exposed (Step S30).

On the other hand, when the shot, which is an exposure target, is not to be aligned with the lower layer (No in Step S20), the alignment correction value calculating unit 21A does not acquire information when the lower layer is exposed. For example, a shot of the layer which is first formed on the wafer 15 is not to be aligned with the lower layer. In addition, a shot for forming, for example, a dummy shot may not be aligned with the lower layer.

The focus map measurement device 4 measures the focus map (upper layer focus map) of the loaded wafer 15 (Step S40). The alignment measurement device 3 measures the mark position (alignment data) of the loaded wafer 15. As such, the focus map or the alignment data is measured, with the wafer 15 mounted on the wafer stage 16 before the exposure process.

Then, the exposure mechanism 10A aligns the wafer 15. Specifically, the exposure mechanism 10A aligns an upper layer with the lower layer (Step S50). In this case, the exposure mechanism 10A aligns the mark position of the lower-layer-side pattern with the mark position of the upper-layer-side pattern to align the wafer 15.

The alignment correction value calculating unit 21A calculates the alignment correction value on the basis of information about the position of the lower-layer-side pattern and information about the position of the upper-layer-side pattern. The information about the position of the lower-layer-side pattern includes three information items, that is, the lower layer alignment data, the lower layer input correction value, and the lower layer focus map. The information about the position of the upper-layer-side pattern includes three information items, that is, upper layer alignment data, an upper layer input correction value, and upper layer focus map.

The exposure mechanism 10A corrects an exposure position using the alignment correction value calculated by the alignment correction value calculating unit 21A. As such, the exposure apparatus 1A corrects the exposure position using the upper layer alignment data, the upper layer input correction value, and the upper layer focus map (Step S60). Then, the exposure mechanism 10A exposes the wafer 15 (Step S70).

As such, since the exposure apparatus 1A calculates the alignment correction value on the basis of the information about the position of the lower-layer-side pattern and the information about the position of the upper-layer-side pattern, it is possible to improve overlay accuracy even though the wafer 15 warps.

Figure 3A:
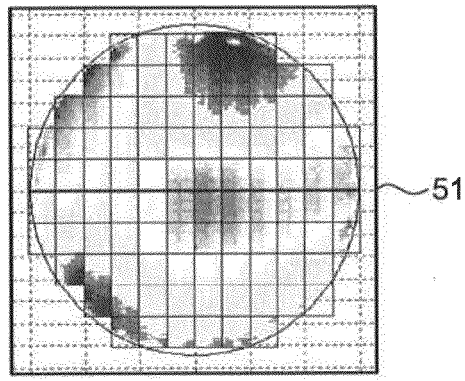
FIGS. 3A to 3C are diagrams illustrating a process of calculating an alignment correction value.
Figure 3B:
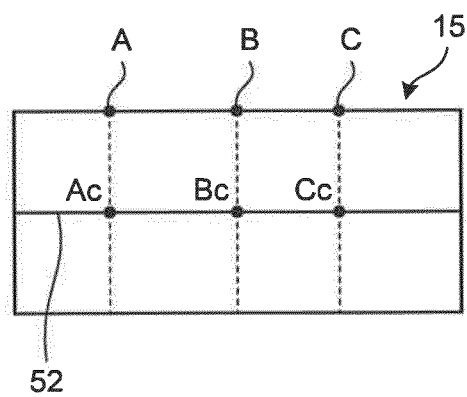
Figure 3C:
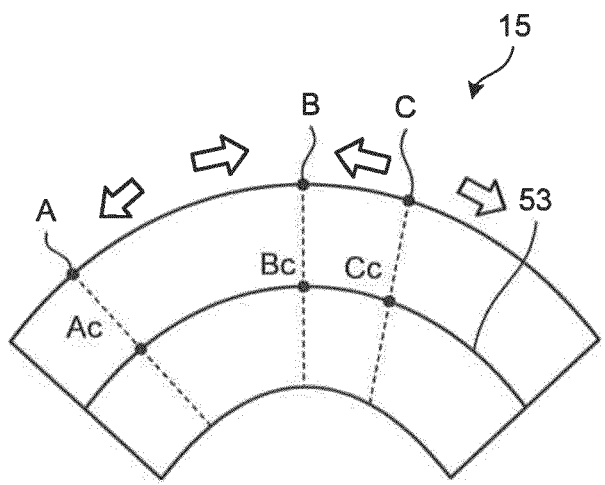

FIGS. 3A to 3C are diagrams illustrating a process of calculating the alignment correction value. FIG. 3A illustrates an example of the focus map. FIG. 3B is a cross-sectional view illustrating the distortion of the wafer 15.

A focus map 51 indicates the height of the front surface of the wafer 15. The height of the wafer 15 is represented by color density. As illustrated in FIG. 3A, the wafer 15 has various heights due to, for example, distortion. The focus map 51 is used to correct the focus during exposure and is also used to calculate the alignment correction value.

In FIG. 3B, positions A, B, and C are on the front surface of the wafer 15 and positions Ac, Bc, and Cc are on a middle surface 52 (an intermediate plane in a film thickness direction) of the wafer 15. When no distortion occurs in the wafer 15, the positions A, B, and C are arranged on one parallel plane and the positions Ac, Bc, and Cc are arranged on one parallel plane.

When distortion occurs in the wafer 15 and the wafer 15 is deformed, the positions A, B, and C are arranged on one curved surface and the positions Ac, Bc, and Cc are arranged on one curved surface. FIG. 3C illustrates a case in which the wafer 15 warps upward. In this case, the distance between the positions A and B and the distance between the positions B and C are more than those when no distortion occurs in the wafer 15. In other words, when distortion occurs in the wafer 15 and the wafer 15 is deformed, the front surface of the wafer 15 extends, as compared to a case in which no distortion occurs in the wafer 15.

When distortion occurs in the wafer 15 and the wafer 15 is deformed, the middle surface 52, which is a horizontal plane, of the wafer 15 changes to a middle surface 53 which is a curved surface. In this case, the distance between the positions Ac and Bc and the distance between the positions Bc and Cc are invariable.

As such, when distortion occurs in the wafer 15 and the wafer 15 is deformed, the positions A, B, and C on the front surface of the wafer 15 are changed. The amount of deformation of the wafer 15 corresponds to the focus map 51. Therefore, in this embodiment, the alignment correction value calculating unit 21 calculates the alignment correction value using the focus map 51 of the lower-layer-side pattern and the upper-layer-side pattern. The alignment correction value calculating unit 21A predicts the positional deviation between the upper-layer-side pattern and the lower-layer-side pattern using, for example, the following Expression 1 and calculates the alignment correction value on the basis of the prediction result. The alignment correction value calculating unit 21A calculates the alignment correction value such that the positional deviation is removed.

[Expression 1]

$$dx_i(x, y) = f_i(x, y) - \frac{t}{2}n_x(x, y) + \frac{1}{2}\int_0^x \left(\frac{\partial h_c(\xi, y)}{\partial \xi}\right)^2 d\xi$$
$$dy_i(x, y) = g_i(x, y) - \frac{t}{2}n_y(x, y) + \frac{1}{2}\int_0^y \left(\frac{\partial h_c(x, \eta)}{\partial \eta}\right)^2 d\eta \quad (1)$$

Expression 1 is a model equation for predicting the deviation of the transfer position of each of the lower-layer-side pattern and the upper-layer-side pattern. In Expression 1, $f_i$, $g_i$, $n_x$, $n_y$, and $h_c$ have individual values for each of the lower-layer-side pattern and the upper-layer-side pattern. Herein, index (subscript) "i" corresponds to number of exposure field. In Expression 1, $dx_i$ indicates the positional deviation of the x coordinate of the wafer 15 in the horizontal direction (on the main surface) and $dy_i$ indicates the positional deviation of the y coordinate of the wafer 15 in the horizontal direction (on the main surface). In addition, "t" indicates the thickness of the wafer 15. Furthermore, $n_x$ indicates an x component of a normal vector on the surface of the wafer 15 and $n_y$ indicates a y component of the normal vector on the surface of the wafer 15. In addition, $h_c$ indicates the amount of deviation of the positions Ac, Bc, and Cc in the height direction. Moreover, $f_i$ and $g_i$ indicates the predicted amounts of deviation of the pattern transfer positions that are calculated with a conventional technology by using only the alignment measurement result and the input correction value.

It is possible to predict the amount of relative deviation of the upper-layer-side pattern with respect to the lower-layer-side pattern by calculating each of the upper-layer-side pattern and the lower-layer-side pattern using Expression 1 and then calculating the difference between them.

When a semiconductor device (semiconductor integrated circuit) is manufactured, for example, a film forming process, an exposure process, a development process, and an etching process for the wafer 15 are repeatedly performed for each layer. Specifically, after a film to be processed is formed on the wafer 15, a resist is applied onto the film to be processed. The wafer 15 having the resist applied thereonto is exposed using a mask (for example, the reticle 12) having a circuit pattern formed therein.

The exposure process is performed by, for example, the exposure apparatus 1A. When the exposure apparatus 1A is used to expose the upper-layer-side pattern of the wafer 15, the alignment correction value calculating unit 21A calculates the alignment correction value. Then, the alignment correction value is used to correct the exposure position.

After the exposure process, the wafer 15 is developed and a resist pattern is formed on the wafer 15. Then, the film to be processed is etched using the resist pattern as a mask. In this way, a pattern is formed on the film to be processed.

The measurement result of the mark position, the measurement result of the focus map, or the input correction value may not be stored in the measurement result DB 22A, but may be stored in an external apparatus. In this case, the alignment correction value calculating unit 21A acquires the measurement result of the focus map or the input correction value from the external apparatus and calculates the alignment correction value.

In addition, the lower layer alignment data or the lower layer focus map which is used when the alignment correction value calculating unit 21A calculates the alignment correction value may be measured by the exposure apparatus 1A, or it may be measured by an apparatus other than the exposure apparatus 1A.

As such, according to the first embodiment, the lower layer alignment data, the lower layer input correction value, and the lower layer focus map are used to calculate a correction value for the alignment of the upper-layer-side pattern with the lower-layer-side pattern. Therefore, it is possible to easily improve the overlay accuracy between the upper-layer-side pattern and the lower-layer-side pattern with a simple structure. As a result, it is possible to accurately overlap the layers of a semiconductor device.

Second Embodiment

Next, a second embodiment will be described with reference to FIG. 4. In the second embodiment, when an exposure mechanism formed by a reflective projection optical system is used to perform exposure, lower layer alignment data, a lower layer input correction value, and a lower layer focus map are used to calculate a correction value for the alignment of an upper-layer-side pattern with a lower-layer-side pattern.

Figure 4:
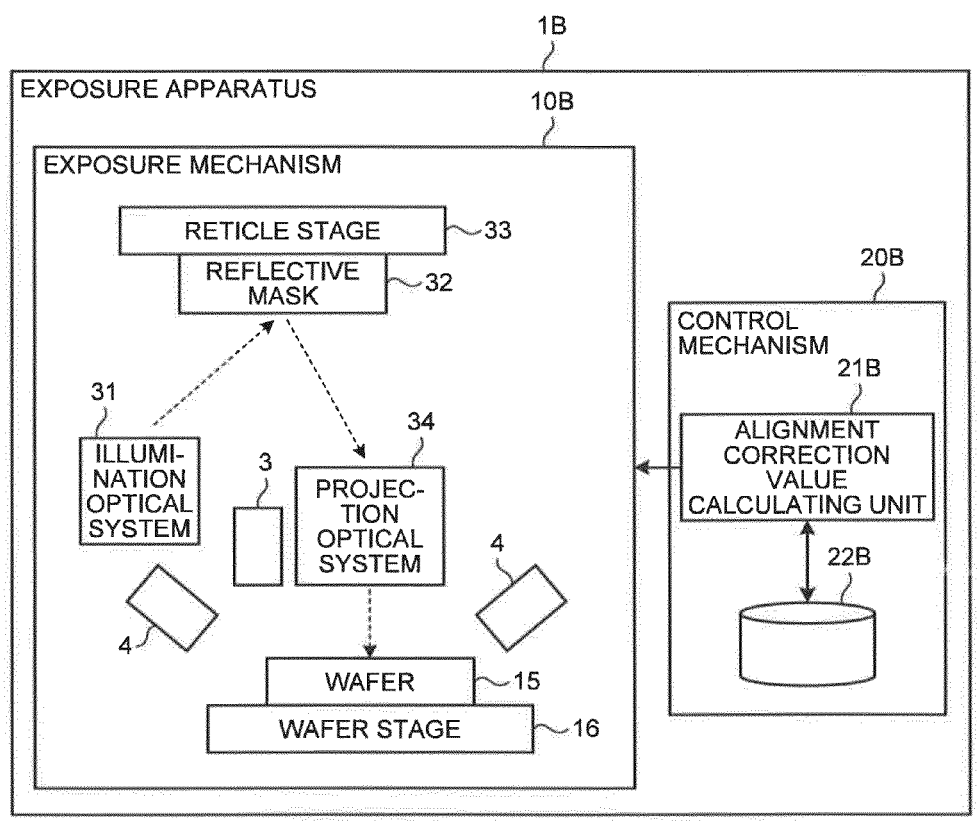
FIG. 4 is a diagram illustrating the structure of an exposure apparatus according to a second embodiment.

FIG. 4 is a diagram illustrating the structure of an exposure apparatus according to the second embodiment. Among components illustrated in FIG. 4, components having the same functions as those in the exposure apparatus 1A according to the first embodiment illustrated in FIG. 1 are denoted by the same reference numerals and the description thereof will not be repeated.

An exposure apparatus 1B is, for example, an extreme ultraviolet (EUV) exposure apparatus and exposes a wafer 15 using a reflective projection optical system. The exposure apparatus 1B includes an exposure mechanism 10B that performs reflective projection exposure on the wafer 15 and a control mechanism 20B that controls the exposure mechanism 10B. The exposure mechanism 10B includes an illumination optical system 31, a reticle stage 33, a projection optical system 34, a wafer stage 16, an alignment measurement device 3, and a focus map measurement device 4.

The illumination optical system 31 radiates exposure light irradiated from a light source (not illustrated) to a reflective mask (reticle) 32 having a mask pattern formed thereon. An alignment mark for measuring the position of the lower-layer-side pattern and a circuit pattern are formed on the reflective mask 32 that is used to form the lower-layer-side pattern. In addition, an alignment mark for measuring the position of the upper-layer-side pattern and a circuit pattern are formed on the reflective mask 32 that is used to form the upper-layer-side pattern.

The reflective mask 32 is mounted on the reticle stage 33. The projection optical system 34 radiates the exposure light reflected from the reflective mask 32 to the wafer 15 to perform the reduced projection of a mask pattern to the wafer 15.

The control mechanism 20B has the same functions (an alignment correction value calculating unit 21B and a measurement result DB 22B) as the control mechanism 20A. The alignment correction value calculating unit 21B has the same function as the alignment correction value calculating unit 21A and the measurement result DB 22B has the same function as the measurement result DB 22A.

Similarly to the exposure apparatus 1A, in the exposure apparatus 1B, the alignment correction value calculating unit 21B calculates an alignment correction value using lower layer alignment data, a lower layer input correction value, a lower layer focus map, upper layer alignment data, an upper layer input correction value, and an upper layer focus map.

The lower layer alignment data or the lower layer focus map which is used when the alignment correction value calculating unit 21B calculates the alignment correction value may be measured by the exposure apparatus 1B, or it may be measured by an apparatus other than the exposure apparatus 1B.

As such, according to the second embodiment, the lower layer alignment data, the lower layer input correction value, and the lower layer focus map are used to calculate a correction value for the alignment of the upper-layer-side pattern with the lower-layer-side pattern. Therefore, it is possible to easily improve the overlay accuracy between the upper-layer-side pattern and the lower-layer-side pattern with a simple structure. As a result, it is possible to accurately overlap the layers of a semiconductor device Third Embodiment Next, a third embodiment will be described with reference to FIG. 5. In the third embodiment, a correction value for the alignment of an upper-layer-side pattern with a lower-layer-side pattern is calculated on the basis of the shape of a reticle.

Figure 5:
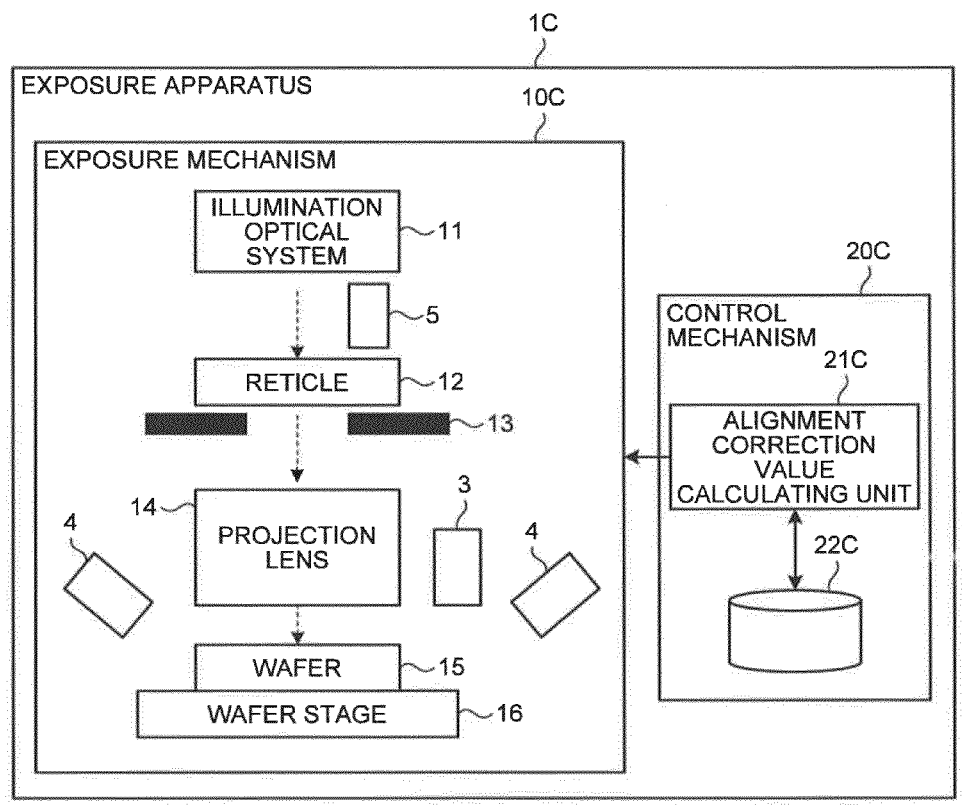
FIG. 5 is a diagram illustrating the structure of an exposure apparatus according to a third embodiment.

FIG. 5 is a diagram illustrating the structure of an exposure apparatus according to the third embodiment. Among components illustrated in FIG. 5, components having the same functions as those in the exposure apparatus 1A according to the first embodiment illustrated in FIG. 1 are denoted by the same reference numerals and the description thereof will not be repeated.

An exposure apparatus 10 includes an exposure mechanism 10C that performs reduced projection exposure on a wafer 15 and a control mechanism 20C that controls the exposure mechanism 10C. The exposure mechanism 10C includes the functions of the exposure mechanism 10A and a reticle shape measurement device 5. Specifically, the exposure mechanism 10C includes an illumination optical system 11, a reticle stage 13, a projection lens 14, a wafer stage 16, an alignment measurement device 3, a focus map measurement device 4, and a reticle shape measurement device 5.

The reticle shape measurement device 5 measures the surface shape of a reticle (for example, a reticle 12) mounted on the reticle stage 13. The reticle shape measurement device 5 measures the position of an outer circumferential portion of the reticle 12 (a portion of the reticle 12 held by the reticle stage 13) to measure the surface shape of the reticle 12. The reticle shape measurement device 5 measures the position (x, y) of the reticle 12 in the main surface direction or the position (z) of the reticle 12 in the thickness direction to measure the distortion (reticle shape) of the reticle 12. The reticle shape measurement device 5 transmits the shape of the reticle, which is the measurement result, to the control mechanism 20C.

The control mechanism 20C includes an alignment correction value calculating unit 21C and a measurement result DB 22C. The alignment correction value calculating unit 21C according to this embodiment calculates an alignment correction value using a reticle shape when the lower-layer-side pattern is transferred and a reticle shape when the upper-layer-side pattern is transferred.

Specifically, the alignment correction value calculating unit 21C calculates the alignment correction value on the basis of lower layer alignment data, a lower layer input correction value, a lower layer focus map, the reticle shape when the lower-layer-side pattern is transferred, upper layer alignment data, an upper layer input correction value, an upper layer focus map, and the reticle shape when the upper-layer-side pattern is transferred.

The alignment correction value calculating unit 21C calculates the alignment correction value using the information stored in the measurement result DB 22C. The measurement result DB 22C is a database that stores the measurement result of the mark position, the measurement result of the focus map, the input correction value, and the reticle shape. The measurement result DR 22C is formed by, for example, a memory.

When the wafer 15 is exposed, the reticle shape measurement device 5, the alignment measurement device 3, and the focus map measurement device 4 measure the wafer 15 which is transported from the outside of the exposure apparatus 1C into the exposure mechanism 10C. The measurement result of the reticle shape, the measurement result of the mark position, and the measurement result of the focus map are transmitted to the control mechanism 20C and are then stored in the measurement result DR 22C.

The alignment correction value calculating unit 21C calculates the alignment correction value using the data stored in the measurement result DB 22C. When the lower-layer-side pattern is transferred to the wafer 15, the input correction value for the lower-layer-side pattern is input from, for example, an external apparatus to the alignment correction value calculating unit 21C. When the lower-layer-side pattern is transferred to the wafer 15, the reticle shape, alignment data (alignment measurement result), the input correction value, and the focus map of the lower-layer-side pattern are stored in the measurement result DB 22C.

When the upper-layer-side pattern is transferred to the wafer 15, the input correction value for the upper-layer-side pattern is input from, for example, an external apparatus to the alignment correction value calculating unit 21C. When the upper-layer-side pattern is transferred to the wafer 15, the reticle shape, alignment data, the input correction value, and the focus map of the upper-layer-side pattern are stored in the measurement result DB 22C.

When the upper-layer-side pattern is transferred onto the lower-layer-side pattern, the alignment correction value calculating unit 21C calculates the alignment correction value using the measurement result the measurement result of the reticle shape, the measurement result of the mark position, and the measurement result of the focus map) of the upper-layer-side pattern, the input correction value for the upper-layer-side pattern, the measurement result of the lower-layer-side pattern, and the input correction value used when the lower-layer-side pattern is transferred. The control mechanism 20C controls the exposure mechanism 10C such that the alignment correction value calculated by the alignment correction value calculating unit 21C is applied, thereby transferring the upper-layer-side pattern to the wafer 15.

In other words, the exposure mechanism 10C corrects the transfer position of the upper-layer-side pattern using the alignment correction value calculated by the alignment correction value calculating unit 21C. Then, the exposure mechanism 10C transfers the upper-layer-side pattern to the corrected transfer position.

When alignment with the lower-layer-side pattern is not performed, the measurement operation of the alignment measurement device 3 or the measurement operation of the reticle shape measurement device 5 is omitted. The reticle shape may be stored in the measurement result DB 22C after the alignment correction value is calculated, or it may be stored in the measurement result DB 22C before the alignment correction value is calculated. When the reticle shape is stored in the measurement result DB 22C after the alignment correction value is calculated, during the calculation of the alignment correction value, the reticle shape is input from the reticle shape measurement device 5 to the alignment correction value calculating unit 21C. In addition, the reticle shape may be stored in the measurement result DB 22C at any time before and after exposure.

The measurement result of the reticle shape, the measurement, result of the mark position, the measurement result of the focus map, or the input correction value may not be stored in the measurement result DB 22C, but may be stored in an external apparatus. In this case, the alignment correction value calculating unit 21C acquires the measurement result of the reticle shape, the measurement result of the focus map, or the input correction value from the external apparatus and calculates the alignment correction value. In addition, the exposure mechanism 10C may be formed using a reflective projection optical system.

The lower layer alignment data, the lower layer focus map, and the reticle shape of the lower-layer-side pattern which are used when the alignment correction value calculating unit 21C calculates the alignment correction value may be measured by the exposure apparatus 1C, or they may be measured by an apparatus other than the exposure apparatus 1C.

As such, according to third embodiment, the reticle shape, the lower layer alignment data, the lower layer input correction value, and the lower layer focus map are used to calculate a correction value of the alignment of the upper-layer-side pattern with the lower-layer-side pattern. Therefore, it is possible to easily improve the overlay accuracy between the upper-layer-side pattern and the lower-layer-side pattern with a simple structure. Therefore, it is possible to accurately overlap the layers of a semiconductor device.

Fourth Embodiment

Next, a fourth embodiment will be described with reference to FIG. 6. In the fourth embodiment, a correction value for the alignment of an upper-layer-side pattern with a lower-layer-side pattern is calculated on the basis of the temperature distribution of a reticle.

Figure 6:
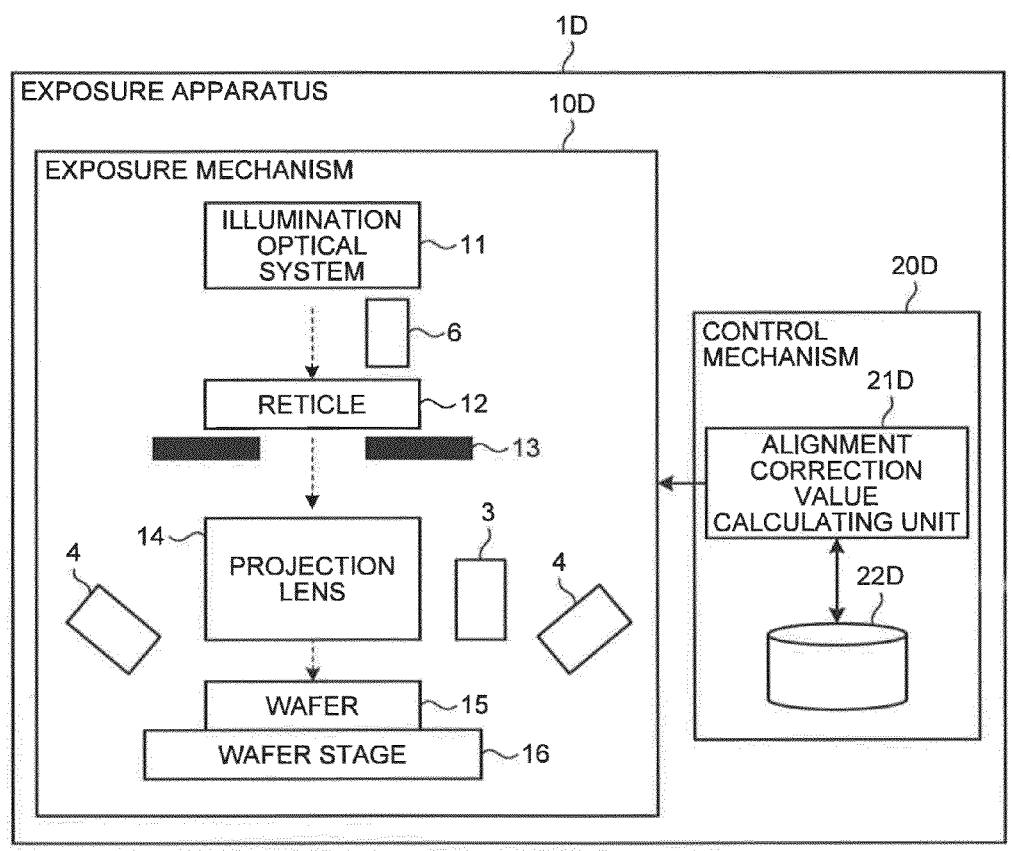
FIG. 6 is a diagram illustrating the structure of an exposure apparatus according to a fourth embodiment.

FIG. 6 is a diagram illustrating the structure of an exposure apparatus according to the fourth embodiment. Among the components illustrated in FIG. 6, components having the same functions as those in the exposure apparatus 1A according to the first embodiment illustrated in FIG. 1 are denoted by the same reference numerals and the description thereof will not be repeated.

An exposure apparatus 1D includes an exposure mechanism 10D that performs reduced projection exposure on a wafer 15 and a control mechanism 20D that controls the exposure mechanism 10D. The exposure mechanism 10D includes the functions of the exposure mechanism 10A and a reticle temperature distribution measurement device 6. Specifically, the exposure mechanism 10D includes an illumination optical system 11, a reticle stage 13, a projection lens 14, a wafer stage 16, an alignment measurement device 3, a focus map measurement device 4, and a reticle temperature distribution measurement device 6.

The reticle temperature distribution measurement device 6 measures the temperature distribution (reticle temperature distribution) of the front surface of a reticle (for example, a reticle 12) mounted on the reticle stage 13. The reticle temperature distribution measurement device 6 transmits the reticle temperature distribution, which is the measurement result, to the control mechanism 20D.

The control mechanism 20D includes an alignment correction value calculating unit 21D and a measurement result DB 22D. The alignment correction value calculating unit 21D according to this embodiment calculates the alignment correction value using the reticle temperature distribution when the lower-layer-side pattern is transferred and the reticle temperature distribution when the upper-layer-side pattern is transferred.

Specifically, the alignment correction value calculating unit 21D calculates the alignment correction value on the basis of lower layer alignment data, a lower layer input correction value, a lower layer focus map, the reticle temperature distribution when the lower-layer-side pattern is transferred, upper layer alignment data, an upper layer input correction value, an upper layer focus map, and the reticle temperature distribution when the upper-layer-side pattern is transferred.

The alignment correction value calculating unit 21D calculates the position (x, y) of the reticle 12 in the direction of the main surface or the position (z) of the reticle 12 in the thickness direction on the basis of the reticle temperature distribution to calculate the amount of distortion (reticle shape) of the reticle 12. Then, the alignment correction value calculating unit 21D calculates the alignment correction value on the basis of the calculated reticle shape using the same process as that of the alignment correction value calculating unit 21O.

The alignment correction value calculating unit 21D calculates the alignment correction value using the information stored in the measurement result DB 22D. The measurement result DB 22D is a database that stores the measurement result of a mark position, the measurement result of a focus map, an input correction value, and the reticle temperature distribution. The measurement result DB 22D is formed by, for example, a memory. The measurement result DB 22D may store the reticle shape calculated from the reticle temperature distribution, instead of the reticle temperature distribution.

When the wafer 15 is exposed, the reticle temperature distribution measurement device 6, the alignment measurement device 3, and the focus map measurement device 4 measure the wafer 15 which is transported from the outside of the exposure apparatus 1D into the exposure mechanism 10D. The measurement result of the reticle temperature distribution, the measurement result of the mark position, and the measurement result of the focus map are transmitted to the control mechanism 20D and are then stored in the measurement result DB 22D.

The alignment correction value calculating unit 21D calculates the alignment correction value using the data stored in the measurement result DB 22D. When the lower-layer-side pattern is transferred to the wafer 15, the input correction value for the lower-layer-side pattern is input from, for example, an external apparatus to the alignment correction value calculating unit 21D. When the lower-layer-side pattern is transferred to the wafer 15, the reticle temperature distribution, the alignment data (alignment measurement result), the input correction value, and the focus map of the lower-layer-side pattern are stored in the measurement result DB 22D.

When the upper-layer-side pattern is transferred to the wafer 15, the input correction value for the upper-layer-side pattern is input from, for example, an external apparatus to the alignment correction value calculating unit 21D. When the upper-layer-side pattern is transferred to the wafer 15, the reticle temperature distribution, alignment data, the input correction value, and the focus map of the upper-layer-side pattern are stored in the measurement result DB 22D.

When the upper-layer-side pattern is transferred onto the lower-layer-side pattern, the alignment correction value calculating unit 21D calculates the alignment correction value using the measurement result (the measurement result of the reticle temperature distribution, the measurement result of the mark position, and the measurement result of the focus map) of the upper-layer-side pattern, the input correction value for the upper-layer-side pattern, the measurement result of the lower-layer-side pattern, and the input correction value which is used when the lower-layer-side pattern is transferred. The control mechanism 20D controls the exposure mechanism 10D such that the alignment correction value calculated by the alignment correction value calculating unit 21D is applied, thereby transferring the upper-layer-side pattern to the wafer 15.

In other words, the exposure mechanism 10D corrects the transfer position of the upper-layer-side pattern using the alignment correction value calculated by the alignment correction value calculating unit 21D. Then, the exposure mechanism 10D transfers the upper-layer-side pattern to the corrected transfer position.

When alignment with the lower-layer-side pattern is not performed, the measurement operation of the alignment measurement device 3 or the measurement operation of the reticle temperature distribution measurement device 6 is omitted. The reticle temperature distribution may be stored in the measurement result DB 22D after the alignment correction value is calculated, or it may be stored in the measurement result DB 22D before the alignment correction value is calculated. When the reticle temperature distribution is stored in the measurement result DB 22D after the alignment correction value is calculated, during the calculation of the alignment correction value, the reticle temperature distribution is input from the reticle temperature distribution measurement device 6 to the alignment correction value calculating unit 21D. In addition, the reticle shape may be stored in the measurement result DB 22D at any time before and utter exposure.

The measurement result of the reticle temperature distribution, the measurement result of the mark position, the measurement result of the focus map, or the input correction value may not be stored in the measurement result DB 22D, but may be stored in the external apparatus. In this case, the alignment correction value calculating unit 21D acquires the measurement result of the reticle temperature distribution, the measurement result of the focus map, or the input correction value from the external apparatus and calculates the alignment correction value. In addition, the exposure mechanism 10D may be formed using a reflective projection optical system.

The lower layer alignment data, the lower layer focus map, and the reticle temperature distribution of the lower-layer-side pattern which are used when the alignment correction value calculating unit 21D calculates the alignment correction value may be measured by the exposure apparatus 1D, or they may be measured by an apparatus other than the exposure apparatus 1D.

As such, according to the fourth embodiment, the reticle temperature distribution, the lower layer alignment data, the lower layer input correction value, and the lower layer focus map are used to calculate a correction value for the alignment of the upper-layer-side pattern with the lower-layer-side pattern. Therefore, it is possible to easily improve the overlay accuracy between the upper-layer-side pattern and the lower-layer-side pattern, with a simple structure. Therefore, it is possible to accurately overlap the layers of a semiconductor device.

Fifth Embodiment

Next, a fifth embodiment will be described with reference to FIG. 7. In the fifth embodiment, a correction value for the alignment of an upper-layer-side pattern with a lower-layer-side pattern is calculated on the basis of the temperature distribution of a wafer 15.

Figure 7:
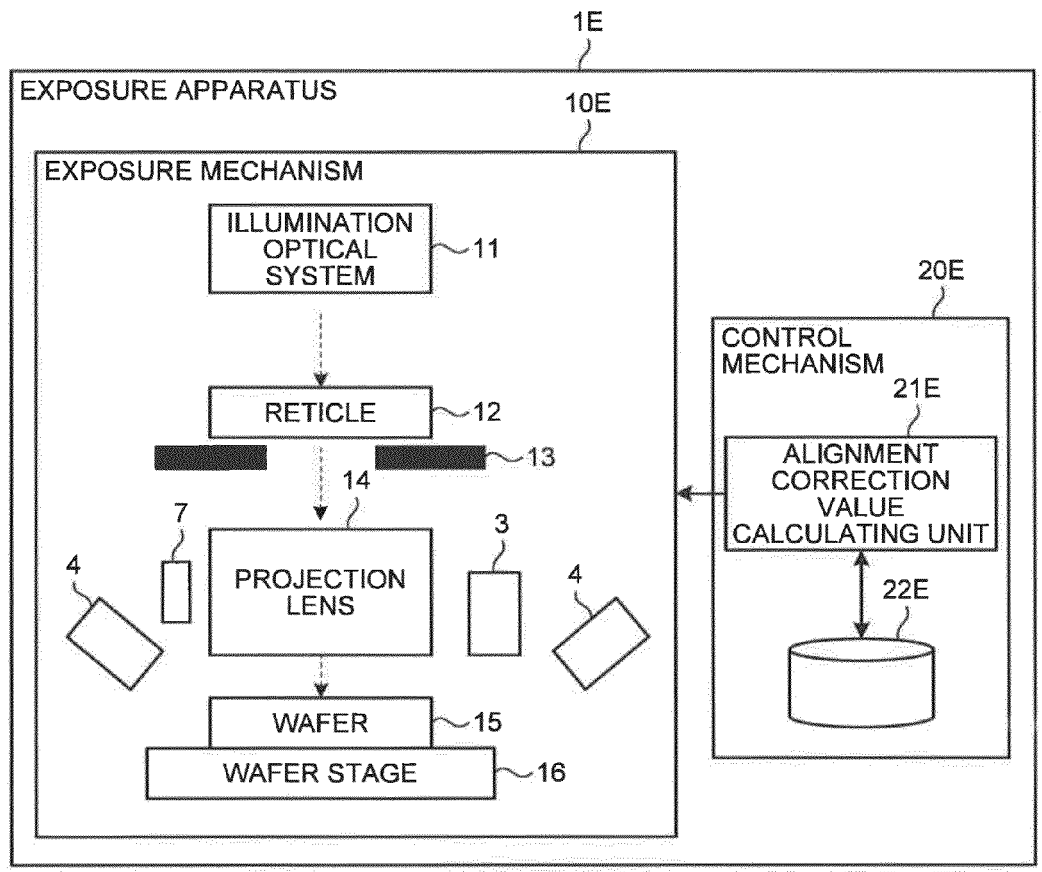
FIG. 7 is a diagram illustrating the structure of an exposure apparatus according to a fifth embodiment.

FIG. 7 is a diagram illustrating the structure of an exposure apparatus according to the fifth embodiment. Among the components illustrated in FIG. 7, components having the same functions as those in the exposure apparatus 1A according to the first embodiment illustrated in FIG. 1 are denoted by the same reference numerals and the description thereof will not be repeated.

An exposure apparatus 15 includes an exposure mechanism 10E that performs reduced projection exposure on the wafer 15 and a control mechanism 20E that controls the exposure mechanism 10E. The exposure mechanism. 10E includes the functions of the exposure mechanism 10A and a wafer temperature distribution measurement device 7. Specifically, the exposure mechanism 10E includes an illumination optical system 11, a reticle stage 13, a projection lens 14, a wafer stage 16, an alignment measurement device 3, a focus map measurement device 4, and the wafer temperature distribution measurement device 7.

The wafer temperature distribution measurement device 7 measures the surface temperature distribution (wafer temperature distribution) of the wafer (for example, the wafer 15) mounted on the wafer stage 16. The wafer temperature distribution measurement device 7 transmits the wafer temperature distribution, which is the measurement result, to the control mechanism 20E.

The control mechanism 20E includes an alignment correction value calculating unit 21E and a measurement result DB 22E. The alignment correction value calculating unit 21E according to this embodiment calculates the alignment correction value using the wafer temperature distribution when the lower-layer-side pattern is transferred and the wafer temperature distribution when the upper-layer-side pattern is transferred.

Specifically, the alignment correction value calculating unit 21E calculates the alignment correction value on the basis of lower layer alignment data, a lower layer input correction value, a lower layer focus map, the wafer temperature distribution when the lower-layer-side pattern is transferred, upper layer alignment data, an upper layer input correction value, an upper layer focus map, and the wafer temperature distribution, when the upper-layer-side pattern is transferred.

The alignment correction value calculating unit 21E calculates the position (x, y) of the wafer 15 in the direction of the main surface or the position (z) of the wafer 15 in the thickness direction on the basis of the wafer temperature distribution to calculate the amount of distortion (the surface shape of the wafer, such as unevenness) of the wafer 15. Then, the alignment correction value calculating unit 21E calculates the alignment correction value on the basis of the calculated shape of the wafer using the same process as that of the alignment correction value calculating unit 21A.

The alignment correction value calculating unit 21E calculates the alignment correction value using the information stored in the measurement result DB 22E. The measurement result DB 22E is a database that stores the measurement result of a mark position, the measurement result of a focus map, an input correction value, and the wafer temperature distribution. The measurement result DB 22E is formed by, for example, a memory. The measurement result DB 22E may store the shape of the wafer calculated from the wafer temperature distribution, instead of the wafer temperature distribution.

When the wafer 15 is exposed, the focus map measurement device 4, the alignment measurement device 3, and the wafer temperature distribution measurement device 7 measure the wafer 15 which is transported from the outside of the exposure apparatus 1E into the exposure mechanism 10E. The measurement result of the wafer temperature distribution, the measurement result of the mark position, and the measurement result of the focus map are transmitted to the control mechanism 20E and are then stored in the measurement result DB 22E.

The alignment correction value calculating unit 21E calculates the alignment correction value using the data stored in the measurement result DB 22E. When the lower-layer-side pattern is transferred to the wafer 15, the input correction value for the lower-layer-side pattern is input from, for example, an external apparatus to the alignment correction value calculating unit 21E. When the lower-layer-side pattern is transferred to the wafer 15, the wafer temperature distribution, alignment data (alignment measurement result), the input correction value, and the focus map of the lower-layer-side pattern are stored in the measurement result DB 22E.

When the upper-layer-side pattern is transferred to the wafer 15, the input correction value for the upper-layer-side pattern is input from, for example, an external apparatus to the alignment correction value calculating unit 21E. When the upper-layer-side pattern is transferred to the wafer 15, the wafer temperature distribution, alignment-data, the input correction value, and the focus map of the upper-layer-side pattern are stored in the measurement result DB 22E.

When the upper-layer-side pattern is transferred onto the lower-layer-side pattern, the alignment correction. Value calculating unit 21E calculates the alignment correction. Value using the measurement result (the measurement result of the wafer temperature distribution, the measurement result of the mark position, and the measurement result of the focus map) of the upper-layer-side pattern, the input correction value for the upper-layer-side pattern, the measurement result of the lower-layer-side pattern, and the input correction value which is used when the lower-layer-side pattern is transferred. The control mechanism 20E controls the exposure mechanism 10E such that the alignment correction value calculated by the alignment correction value calculating unit 21E is applied, thereby transferring the upper-layer-side pattern to the wafer 15.

In other words, the exposure mechanism 10E corrects the transfer position of the upper-layer-side pattern using the alignment correction value calculated by the alignment correction value calculating unit 21E. Then, the exposure mechanism 10E transfers the upper-layer-side pattern to the corrected transfer position.

When alignment with the lower-layer-side pattern is not performed, the measurement operation of the alignment measurement device 3 or the measurement operation of the wafer temperature distribution measurement device 7 is omitted. The wafer temperature distribution may be stored in the measurement result DB 22E after the alignment correction value is calculated, or it may be stored in the measurement result DB 22E before the alignment correction value is calculated. When the wafer temperature distribution is stored in the measurement result DB 22B after the alignment correction value is calculated, during the calculation of the alignment correction value, the wafer temperature distribution is input from the wafer temperature distribution measurement device 7 to the alignment correction value calculating unit 21E. In addition, the shape of the wafer may be stored in the measurement result DB 225 at any time before and after exposure.

The measurement result of the wafer temperature distribution, the measurement result of the mark position, the measurement result of the focus map, or the input correction value may not be stored in the measurement result DB 22E, but may be stored in an external, apparatus. In this case, the alignment correction value calculating unit 21E acquires the measurement result of the wafer temperature distribution, the measurement result of the focus map, or the input correction value from the external apparatus and calculates the alignment correction. Value. In addition, the exposure mechanism 10E may be formed using a reflective projection optical system.

The lower layer alignment data, the lower layer focus map, and the wafer temperature distribution of the lower-layer-side pattern which are used when the alignment correction value calculating unit 21E calculates the alignment correction value may be measured by the exposure apparatus 1E, or they may be measured by an apparatus other than the exposure apparatus 1E.

Next, the hardware structure of each of the alignment correction value calculating units 21A to 21E will be described. Since the alignment correction value calculating units 21A to 21E have the same hardware structure, only the hardware structure of the alignment correction value calculating unit 21A will be described.

Figure 8:
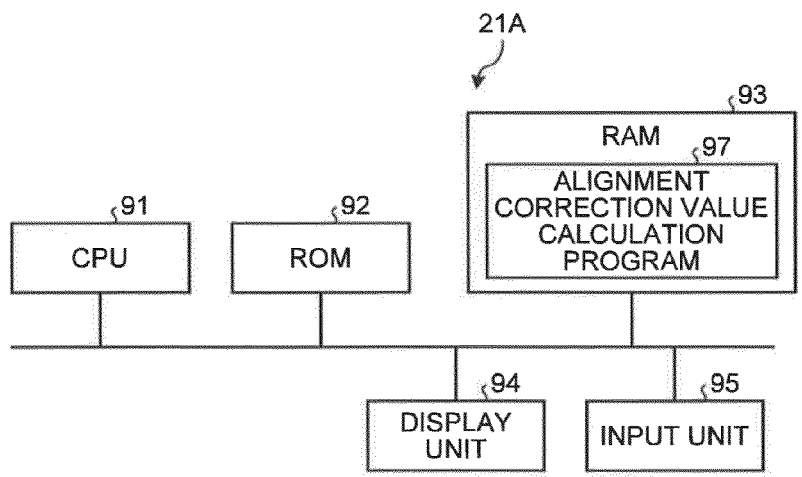
FIG. 8 is a diagram illustrating the hardware structure of an alignment correction value calculating unit.

FIG. 8 is a diagram illustrating the hardware structure of the alignment correction value calculating unit. The alignment correction value calculating unit 21A includes a central processing unit (CPU) 91, a read only memory (ROM) 92, a random access memory (RAM) 93, a display unit 94, and an input unit 95. In the alignment correction value calculating unit 21A, the CPU 91, the ROM 92, the RAM 93, the display unit 94, and the input unit 95 are connected to each other through a bus line.

The CPU 91 calculates the alignment correction value using an alignment correction value calculation program 97 which is a computer program. The alignment correction value calculation program 97 is a computer program product with a computer-readable non-transitory recording medium including a plurality of instructions which can be executed by the computer and are used to calculate the alignment correction value. In the alignment correction value calculate program 97, the plurality of instructions cause the computer to calculate the alignment correction value.

The display unit 94 is a display device, such as a liquid crystal monitor, and displays, for example, the alignment data, the input correction value, the focus map, and the alignment correction value on the basis of the instructions from the CPU 91. The input unit 95 inputs instruction information (for example, parameters required to calculate the alignment correction value) which is input from, for example, an external apparatus other than the alignment correction value calculating unit. The input unit 95 may include a mouse or a keyboard and the user may input instruction information to the input unit 95. The instruction information input to the input unit 95 is transmitted to the CPU 91.

The alignment correction value calculation program 97 is stored in the ROM 92 and is loaded to the RAM 93 through the bus line. FIG. 8 illustrates a state in which the alignment correction value calculation program 97 is loaded to the RAM 93.

The CPU 91 executes the alignment correction value calculation program 97 loaded to the RAM 93. Specifically, in the alignment correction value calculating unit 21A, the CPU 91 reads the alignment correction value calculation program 97 from the ROM 92, develops the alignment correction value calculation program 97 in a program storage region of the RAM 93, and executes various kinds of processes, in response to the instructions input from the input unit 95 by the user. The CPU 91 temporarily stores various kinds of data generated during various kinds of processes in a data storage region formed in the RAM 93.

As such, according to the fifth embodiment, the wafer temperature distribution, the lower layer alignment data, the lower layer input correction value, and the lower layer focus map are used to calculate the correction value for the alignment of the upper-layer-side pattern with the lower-layer-side pattern. Therefore, it is possible to easily improve the overlay accuracy between the upper-layer-side pattern and the lower-layer-side pattern with a simple structure. Therefore, it is possible to accurately overlap the layers of a semiconductor device.

FIG. 9 is a diagram illustrating another example of the focus map measurement device. Among components illustrated in FIG. 9, components having the same functions as those in the exposure apparatus 1A according to the first embodiment illustrated in FIG. 1 are denoted by the same reference numerals and the description thereof will not be repeated.

An exposure apparatus 1X includes an exposure mechanism 10X that performs reduced projection exposure on the wafer 15 and a control mechanism 20X that controls the exposure mechanism. 10X. The exposure mechanism 10X has the same function as that of any of the exposure mechanisms 10A to 10E. The control mechanism 20X has the same function as that of any of the control mechanisms 20A to 20E. The exposure mechanism 10X includes a focus map measurement device 40 instead of the focus map measurement device 4. The focus map measurement device 40 measures the focus map of the wafer 15 by hitting a beam on the entire surface of the wafer 15 and measuring an obtained interference pattern.

The exposure mechanism 10X measures the focus map of the wafer 15 with the wafer 15 being mounted on the wafer stage 16. The exposure mechanism 10X is configure capable of moving, after measuring the focus map of the wafer 15, to under the projection lens 14.

As such, according to the first to fifth embodiments, it is possible to accurately overlap the layers of a semiconductor device.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure apparatus comprising:
    an exposure unit that irradiates exposure light to an original plate on which a mask pattern is formed to transfer a pattern corresponding to the mask pattern to a substrate; and
    a control unit that controls the exposure unit,
    wherein the exposure unit includes:
    an alignment data measuring unit that measures alignment data for the substrate; and
    a focus map measuring unit that measures a focus map of the substrate,
    the control unit includes an alignment correction value calculating unit that calculates an alignment correction value used when an upper-layer-side pattern is positioned relative to a lower-layer-side pattern of an exposure target substrate, which is a substrate to be exposed, on the basis of lower-layer-side position information about a position of the lower-layer-side pattern and upper-layer-side position information about a position of the upper-layer-side pattern which is transferred to the exposure target substrate,
    the lower-layer-side position information includes:
    lower layer alignment data which is alignment data measured when the lower-layer-side pattern is transferred;
    a lower layer focus map which is a focus map measured when the lower-layer-side pattern is transferred; and
    a lower layer correction value which is used when the lower-layer-side pattern is formed and is a correction value for the positioning that is set on the basis of a history of a positional deviation between a lower-layer-side pattern and an upper-layer-side pattern acquired from a substrate which is exposed earlier than the exposure target substrate,
    the upper-layer-side position information includes:
    upper layer alignment data which is alignment data measured by the alignment data measuring unit when the upper-layer-side pattern is transferred;
    an upper layer focus map which is a focus map measured by the focus map measuring unit when the upper-layer-side pattern is formed; and
    an upper layer correction value which is a correction value for the positioning and is used when the upper-layer-side pattern is transferred, and
    the control unit controls the positioning of the upper-layer-side pattern relative to the lower-layer-side pattern using the alignment correction value calculated by the alignment correction value calculating unit.

2. The exposure apparatus according to claim 1,
    wherein the exposure unit further includes an original plate shape measurement device that measures a surface shape of the original plate,
    the lower-layer-side position information further includes a surface shape of an original plate for a lower layer which is measured when the lower-layer-side pattern is transferred to the original plate for the lower layer used to form the lower-layer-side pattern, and
    the upper-layer-side position information further includes a surface shape of an original, plate for an upper layer which is measured by the original plate shape measurement device when the upper-layer-side pattern is transferred to the original plate for the upper layer used to form the upper-layer-side pattern.

3. The exposure apparatus according to claim 1,
    wherein the exposure unit further includes an original plate temperature distribution measurement device that measures a temperature distribution of the original plate,
    the lower-layer-side position information further includes a temperature distribution of an original plate for a lower layer which is measured when the lower-layer-side pattern is transferred to the original plate for the lower layer used to form the lower-layer-side pattern, and
    the upper-layer-side position information further includes a temperature distribution of an original plate for an upper layer which is measured by the original plate temperature distribution measurement device when the upper-layer-side pattern is transferred to the original plate for the upper layer used to form the upper-layer-side pattern.

4. The exposure apparatus according to claim 1,
    wherein the exposure unit further includes a substrate temperature distribution measurement device that measures a temperature distribution of the substrate,
    the lower-layer-side position information further includes a temperature distribution of the substrate which is measured when the lower-layer-side pattern is transferred, and
    the upper-layer-side position information further includes a temperature distribution of the substrate which is measured by the substrate temperature distribution measurement device when the upper-layer-side pattern is transferred.

5. The exposure apparatus according to claim 3,
    wherein the alignment correction value calculating unit calculates an amount of distortion of the lower-layer-side pattern on the basis of the temperature distribution of the original plate for the lower layer, calculates an amount of distortion of the upper-layer-side pattern on the basis of the temperature distribution of the original plate for the upper layer, and calculates the alignment correction, value using the calculation results.

6. The exposure apparatus according to claim 4, wherein the alignment correction value calculating unit calculates an amount of distortion of the lower-layer-side pattern on the basis of the temperature distribution of the substrate which is measured when the lower-layer-side pattern is transferred, calculates an amount of distortion of the upper-layer-side pattern on the basis of the temperature distribution of the substrate which is measured when the upper-layer-side pattern is transferred, and calculates the alignment correction value using the calculation results.

7. The exposure apparatus according to claim 1, wherein the lower layer alignment data is measured by the alignment data measuring unit.

8. The exposure apparatus according to claim 1, wherein the lower layer focus map is measured by the focus map measuring unit.

9. The exposure apparatus according to claim 2, wherein the surface shape of the original plate for the lower layer is measured by the original plate shape measurement device.

10. The exposure apparatus according to claim 3, wherein the temperature distribution of the original plate for the lower layer is measured by the original plate temperature distribution measurement device.

11. The exposure apparatus according to claim 1, wherein the focus map measuring unit measures the focus map, with the substrate mounted on a substrate stage.

12. An exposure method comprising:
measuring alignment data for a substrate;
measuring a focus map of the substrate;
irradiating exposure light to an original plate on which a mask pattern is formed to transfer a pattern corresponding to the mask pattern to the substrate; and
calculating an alignment correction value used when an upper-layer-side pattern is positioned relative to a lower-layer-side pattern of an exposure target substrate, which is a substrate to be exposed, on the basis of lower-layer-side position information about a position of the lower-layer-side pattern and upper-layer-side position information about a position of the upper-layer-side pattern which is transferred to the exposure target substrate, during the exposure process,
wherein the lower-layer-side position information includes:
lower layer alignment data which is alignment data measured when the lower-layer-side pattern is transferred;
a lower layer focus map which is a focus map measured when the lower-layer-side pattern is transferred; and
a lower layer correction value which is used when the lower-layer-side pattern is formed and is a correction value for the positioning that is set on the basis of a history of a positional deviation between a lower-layer-side pattern and an upper-layer-side pattern acquired from a substrate which is exposed earlier than the exposure target substrate,
the upper-layer-side position information includes:
upper layer alignment data which is alignment data measured when the upper-layer-side pattern is transferred;
an upper layer focus map which is a focus map measured when the upper-layer-side pattern is formed; and
an upper layer correction value which is a correction value for the positioning and is used when the upper-layer-side pattern is transferred, and
the positioning of the upper-layer-side pattern relative to the lower-layer-side pattern is controlled using the calculated alignment correction value.

13. The exposure method according to claim 12, wherein the lower-layer-side position information further includes a surface shape of an original plate for a lower layer which is measured when the lower-layer-side pattern is transferred to the original plate for the lower layer used to form the lower-layer-side pattern, and
the upper-layer-side position information further includes a surface shape of an original plate for an upper layer which is measured when the upper-layer-side pattern is transferred to the original plate for the upper layer used to form the upper-layer-side pattern.

14. The exposure method according to claim 12, wherein the lower-layer-side position information further includes a temperature distribution of an original plate for a lower layer which is measured when the lower-layer-side pattern is transferred to the original plate for the lower layer used to form the lower-layer-side pattern, and
the upper-layer-side position information further includes a temperature distribution of an original plate for an upper layer which is measured when the upper-layer-side pattern is transferred to the original plate for the upper layer used to form the upper-layer-side pattern.

15. The exposure apparatus according to claim 12, wherein the lower-layer-side position information further includes a temperature distribution of the substrate which is measured when the lower-layer-side pattern is transferred, and
the upper-layer-side, position information further includes a temperature distribution of the substrate which is measured when the upper-layer-side pattern is transferred.

16. The exposure method according to claim 14, wherein an amount of distortion of the lower-layer-side pattern is calculated on the basis of the temperature distribution of the original plate for the lower layer,
an amount of distortion of the upper-layer-side pattern is calculated on the basis of the temperature distribution of the original plate for the upper layer, and
the alignment correction value is calculated using the calculation results.

17. The exposure method according to claim 15, wherein an amount of distortion of the lower-layer-side pattern is calculated on the basis of the temperature distribution of the substrate which is measured when the lower-layer-side pattern is transferred,
an amount of distortion of the upper-layer-side pattern is calculated on the basis of the temperature distribution of the substrate which is measured when the upper-layer-side pattern is transferred, and
the alignment correction value is calculated using the calculation results.

18. A method of manufacturing a semiconductor device, comprising:
measuring alignment data for a substrate;
measuring a focus map of the substrate;
irradiating exposure light to an original plate on which a mask pattern is formed to transfer a pattern corresponding to the mask pattern to the substrate;
forming an on-substrate pattern corresponding to a transferred pattern on the substrate; and calculating an alignment correction value used when an upper-layer-side pattern is positioned relative to a lower-layer-side pattern of an exposure target substrate, which is a substrate to be exposed, on the basis of lower-layer-side position information about a position of the lower-layer-side pattern and upper-layer-side position information about a position of the upper-layer-side pattern which is transferred to the exposure target substrate, during the exposure process, wherein the lower-layer-side position information includes:

lower layer alignment data which is alignment data measured when the lower-layer-side pattern is transferred;

a lower layer focus map which is a focus map measured when the lower-layer-side pattern is transferred; and a lower layer correction value which is used when the lower-layer-side pattern is formed and is a correction value for the positioning that is set on the basis of a history of a positional deviation between a lower-layer-side pattern and an upper-layer-side pattern acquired from a substrate which is exposed earlier than the exposure target substrate, the upper-layer-side position information includes:

upper layer alignment data which is alignment data measured when the upper-layer-side pattern is transferred;

an upper layer focus map which is a focus map measured when the upper-layer-side pattern is formed; and an upper layer correction value which is a correction value for the positioning and is used when the upper-layer-side pattern is transferred, and the positioning of the upper-layer-side pattern relative to the lower-layer-side pattern is controlled using the calculated alignment correction value.

19. The method of manufacturing a semiconductor device according to claim 18, wherein the lower-layer-side position information further includes a surface shape of an original plate for a lower layer which is measured when the lower-layer-side pattern is transferred to the original plate for the lower layer used to form the lower-layer-side pattern, and the upper-layer-side position information further includes a surface shape of an original plate for an upper layer which is measured when the upper-layer-side pattern is transferred to the original plate for the upper layer used to form the upper-layer-side pattern.

20. The method of manufacturing a semiconductor device according to claim 18, wherein the lower-layer-side position information further includes a temperature distribution of an original plate for a lower layer which is measured when the lower-layer-side pattern is transferred to the original plate for the lower layer used to form the lower-layer-side pattern, and the upper-layer-side position information further includes a temperature distribution of an original plate for an upper layer which is measured when the upper-layer-side pattern is transferred to the original plate for the upper layer used to form the upper-layer-side pattern.

* * * * *